(12) United States Patent
Ecker et al.

(10) Patent No.: US 9,515,657 B2
(45) Date of Patent: Dec. 6, 2016

(54) SYSTEMS AND METHODS FOR DATA RECEIPT FROM DEVICES OF DISPARATE TYPES

(71) Applicant: Marvell Israel (M.I.S.L.) Ltd., Yokneam (IL)

(72) Inventors: Reuven Ecker, Haifa (IL); Basma Abd-elrazek, Jatt (IL)

(73) Assignee: MARVELL ISRAEL (M.I.S.L) LTD., Yokneam (IL)

( * ) Notice: Subject to any disclaimer, the term of this patent is extended or adjusted under 35 U.S.C. 154(b) by 104 days.

(21) Appl. No.: 14/286,099

(22) Filed: May 23, 2014

(65) Prior Publication Data

US 2014/0347098 A1    Nov. 27, 2014

Related U.S. Application Data

(60) Provisional application No. 61/827,116, filed on May 24, 2013, provisional application No. 61/827,209, filed on May 24, 2013.

(51) Int. Cl.
*H03L 5/00* (2006.01)
*H03K 19/0175* (2006.01)

(52) U.S. Cl.
CPC .............................. *H03K 19/017509* (2013.01)

(58) Field of Classification Search
USPC .................. 326/62, 63, 68, 80, 81; 327/333; 365/189.11
See application file for complete search history.

(56) References Cited

U.S. PATENT DOCUMENTS

| | | | | |
|---|---|---|---|---|
| 6,222,385 B1* | 4/2001 | Kang | ............... | H03K 19/01858 326/63 |
| 6,788,125 B1* | 9/2004 | Tomsio | ............ | H03K 19/01852 327/333 |
| 6,920,570 B2* | 7/2005 | Fujimoto | ......... | H03K 19/01758 326/80 |
| 7,375,575 B1* | 5/2008 | Bazes | ................. | H03F 3/45475 326/68 |
| 7,843,247 B1* | 11/2010 | Bazes | ................. | H03F 3/45475 326/68 |
| 8,295,103 B2* | 10/2012 | Sung | ...................... | G11C 16/08 326/68 |
| 8,344,919 B2* | 1/2013 | Tseng | .................. | H03M 1/1028 330/254 |
| 8,797,085 B2* | 8/2014 | Kakamu | .......... | H03K 3/356113 327/108 |

(Continued)

OTHER PUBLICATIONS

Office Action mailed Mar. 2, 2016 in related/corresponding Korean Patent Appl. No. 103118055, filed May 23, 2014.

*Primary Examiner* — Brandon S Cole

(57) ABSTRACT

Systems and methods are provided for a receiver device for receiving data signals from devices of disparate types. An amplifier is configured to receive a voltage reference signal and a data signal, the data signal being received from a device, the amplifier being configured to output an output signal based on a comparison of the data signal to the voltage reference signal. A voltage reference level shifter is configured to selectively level shift the voltage reference signal supplied to the amplifier based on a type of device with which the receiver is communicating. A data signal level shifter is configured to selectively level shift the data signal supplied to the amplifier based on the type of device with which the receiver is communicating.

25 Claims, 11 Drawing Sheets

(56) References Cited

U.S. PATENT DOCUMENTS

| | | | |
|---|---|---|---|
| 2003/0179046 A1* | 9/2003 | Lin | H03G 3/30 |
| | | | 330/254 |
| 2007/0262790 A1* | 11/2007 | Cheon | H03K 19/01852 |
| | | | 326/81 |
| 2009/0184767 A1* | 7/2009 | Hayashi | H03F 3/3022 |
| | | | 330/253 |
| 2012/0092058 A1* | 4/2012 | Cooney | H03K 19/01714 |
| | | | 327/333 |
| 2012/0250426 A1* | 10/2012 | Huang | G11C 7/1066 |
| | | | 365/189.07 |

* cited by examiner

SYSTEMS AND METHODS FOR DATA RECEIPT FROM DEVICES OF DISPARATE TYPES

CROSS-REFERENCE TO RELATED APPLICATIONS

The present application claims priority from U.S. Provisional Application Ser. No. 61/827,116 entitled "A Combined DDR3/DDR4 Receiver Implementation," filed 24 May 2013 and U.S. Provisional Application Ser. No. 61/827,209 entitled "Single Ended DDR Receiver Topology and Implementation for a Fixed-Reference Tunable-Receiver," filed 24 May 2013, the entirety of both of which is hereby incorporated by reference.

FIELD

This disclosure is related generally to data transmission among integrated circuit devices and memories and more particularly to the receipt of data from multiple devices of differing types.

BACKGROUND

Communication protocols enable successful transmission of data between devices. An established protocol enables a receiving device to interpret signals sent by a transmitting device based on those signals being in an expected, predefined format. Over time, communication protocols sometimes change, where such protocol changes are often made to improve overall system communications.

The description above is presented as a general overview of related art in this field and should not be construed as an admission that any of the information it contains constitutes prior art against the present patent application.

SUMMARY

Systems and methods are provided for a receiver device for receiving data signals from devices of disparate types. An amplifier is configured to receive a voltage reference signal a data signal, the data signal being received from a device, the amplifier being configured to output an output signal based on a comparison of the data signal to the voltage reference signal. A voltage reference level shifter is configured to selectively level shift the voltage reference signal supplied to the amplifier based on a type of device with which the receiver is communicating. A data signal level shifter is configured to selectively level shift the data signal supplied to the amplifier based on the type of device with which the receiver is communicating.

As another example, a receiver device for receiving data signals includes a first amplifier configured to receive a voltage reference signal and a data signal, the first amplifier being configured to output a first output signal, the first output signal being based on a first comparison of the data signal to the voltage reference signal. A voltage reference level shifter is configured to selectively level shift the voltage reference signal supplied to the first amplifier, the voltage reference level shifter includes a calibration input, the voltage reference level shifter being configured to adjust an amount of selective level shifting to apply to the voltage reference signal based on the calibration input received at the voltage reference level shifter calibration input. A data signal level shifter is configured to selectively level shift the data signal supplied to the first amplifier, the data signal level shifter including a calibration input, the data signal level shifter being configured to adjust an amount of selective level shifting to apply to the data signal based on the calibration input received at the data signal level shifter calibration input.

As a further example, a method of receiving data signals from devices of disparate types includes determining whether a receiver is communicating with a device of a first type or a second type. The receiver is commanded to operate in a first mode when the receiver is communicating with the first type and a second mode when the receiver is communicating with the second type. A voltage reference signal and a data signal are received, the data signal being received from the device. The voltage reference signal is provided to an amplifier of the receiver via a voltage reference level shifter, the voltage reference level shifter being configured to selectively level shift the voltage reference signal based on whether the receiver is operating in the first mode or the second mode. The data signal is provided to the amplifier of the receiver via a data signal level shifter, the data signal level shifter being configured to selectively level shift the data signal based on whether the receiver is operating in the first mode or the second mode. A first output signal is transmitted from the amplifier.

DETAILED DESCRIPTION

Figure 1:
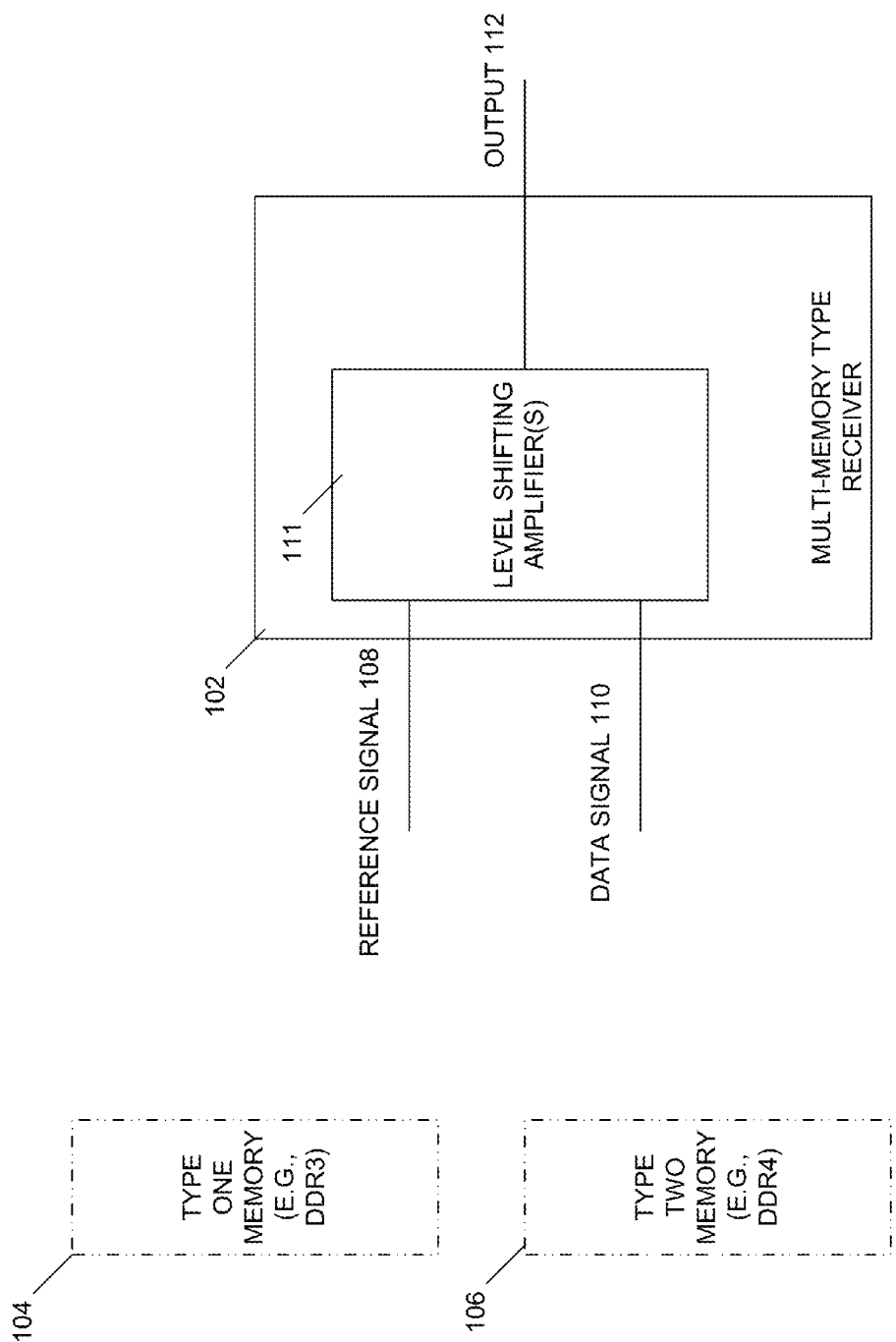
FIG. 1 is a diagram depicting a receiver device for receiving data signals from devices of disparate types in the form of a multi-memory type receiver.

FIG. 1 is a diagram depicting a receiver device for receiving data signals from devices of disparate types in the form of a multi-memory type receiver. The multi-memory type receiver 102 of FIG. 1 is configured to provide a single receiver chain to communicate with memories of different types, specifically a type one DDR3 memory 104 and a type two DDR4 memory 106. The electrical interface specification for the two memory types 104, 106 is different, creating a challenge for supporting both kinds of memory interfaces with a single Input/Output (I/O) receiver. In one embodiment, the DDR3 memory operates using a supply voltage ($V_{DDO}$) of 1.5 or 1.35 volts and a reference voltage $V_{REF}$ for comparison to a data signal of 50% of the $V_{DDO}$ being utilized. The data signal of the DDR3 memory is configured to be, on average, 50% of $V_{DDO}$. In contrast, the DDR4 memory in that embodiment uses a $V_{DDO}$ of 1.2 volts and a reference voltage $V_{REF}$ of 70% of $V_{DDO}$. The data signal of the DDR4 memory is configured to be, on average, 70% of $V_{DDO}$.

While a device could be implemented with two, dedicated types of receivers for communicating with the disparate memory types 104, 106, such a solution is area consuming and adds a redundant capacitive load which affects bandwidth. The embodiments described herein enable communications with the memory devices 104, 106 of disparate types using a single receiver 102. The multi-memory receiver 102 receives a reference signal 108 and a data signal 110, where the data signal is received from a memory device. One or more level shifting amplifiers 111 selectively adjust one or both of the reference signal 108 or the data signal 110 based on a current mode of operation of the receiver 102 so that the reference signal 108 and the data signal 110 are optimized for the operating point of the one or more amplifiers 111. By comparing the data signal 110 to the reference signal 108 during an appropriate sampling window in a clock cycle, the multi-memory type receiver determines a data value that is outputted via output 112.

Figure 2:
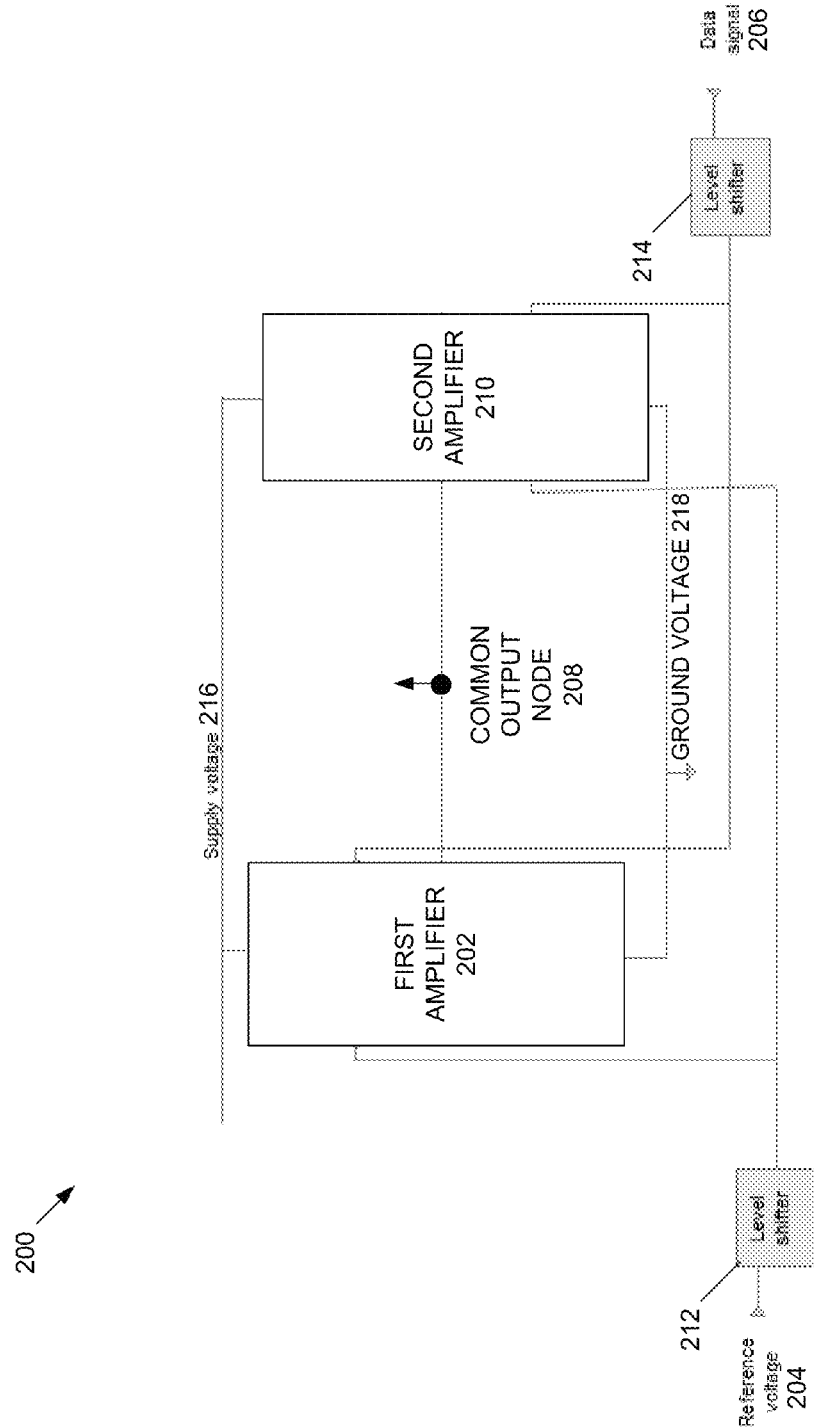
FIG. 2 is a block diagram depicting an example receiver device configured to receive data signals from devices of disparate types in accordance with one embodiment of the disclosure.

FIG. 2 is a block diagram depicting an example receiver device configured, in accordance with an embodiment, to receive data signals from devices of disparate types in accordance with one embodiment of the disclosure (e.g., the multi-memory type receiver 102 of FIG. 1). In the depicted embodiment, the receiver 200 includes a first amplifier 202 configured to receive a voltage reference signal 204 and a data signal 206, the data signal 206 being received from a memory device (e.g., a single ended data signal). The first amplifier 202 is configured to output a first output signal to a common output node 208 based on a first comparison of the data signal 206 to the voltage reference signal 204. For example, in one embodiment, when the data signal 206 exhibits a higher voltage than the reference voltage signal 204, then the first amplifier 202 outputs a voltage substantially equal to the supply voltage 216 to the common output node 208. Alternatively, when the data signal 206 exhibits a lower voltage than the reference signal 204, then the first amplifier 202 outputs a voltage substantially equal to the ground voltage 218 to the common output node 208. In the depicted embodiment, a second amplifier 210 is configured to receive the voltage reference signal 204 and the data signal 206, the data signal being received from the memory device. The second amplifier 210 is configured to output a second output signal to the common output node 208 based on a second comparison of the data signal 206 to the voltage reference signal 204. The receiver includes a voltage reference level shifter 212. The voltage reference level shifter 212 is configured to selectively level shift the voltage reference signal 204 supplied to the first amplifier 202. A data signal level shifter 214 is interposed between the memory device and the first amplifier 202. The data signal level shifter 214 is configured to selectively level shift the data signal 206 supplied to the first amplifier 202. In the example of FIG. 2, the voltage reference level shifter 212 and the data signal level shifter 214 also supply signals to the second amplifier 210, such that both the first amplifier 202 and the second amplifier 210 receive selectively shifted voltage reference signals and data signals.

In one embodiment, the receiver 200 of FIG. 2 operates in one of two modes based on whether the receiver 200 is communicating with a memory device of a first type (e.g., a DDR3 memory) or a memory device of a second type (e.g., a DDR4 memory). When operating in a first mode associated with memory devices (e.g., DDR3 memories) of the first type, the voltage reference level shifter 212 and the data signal level shifter 214 are configured to not level shift the voltage reference signal 204 and the data signal 206, respectively. In this example embodiment, the first amplifier 202 and the second amplifier 210 are configured to process voltage reference signals and data signals associated with the first type of memory devices without adjustment of the voltage levels. A second mode of operation is associated with memory devices of a second type (e.g., DDR4 memories). In an embodiment, when operating in the second mode, the voltage reference level shifter 212 and the data signal level shifter 214 are configured to level shift at least the voltage reference signal 204, and in one embodiment the data signal 206 as well, respectively. Such shifting converts the voltage levels of the signals 204, 206 from the second type of memory to appear to the first amplifier 202 and the second amplifier 210, from the aspect of voltage level, as well as all downstream devices, as if those signals 204, 206 are associated with memories of the first type.

In one embodiment of the disclosure, the first mode of operation is associated with DDR3 memories that utilize a voltage reference signal at 50% of a supply voltage level, indicated in FIG. 2 at 216. In that example, the second mode of operation is associated with DDR4 memories that utilize a voltage reference signal at 70% of the supply voltage level 216. To present a shifted voltage reference signal from a DDR4 memory that appears to the first amplifier 202 and the second amplifier 210 to be a reference signal associated with a DDR3 memory, the voltage reference level shifter shifts the received voltage reference signal 204 from about 70% (+/−10%) of the supply voltage 216 to about 50% (+/−10%) of the supply voltage level 216. The data signal level shifter 214 shifts the data signal 206 in the second mode of operation to compensate for the different average data signal voltage utilized by DDR4 memories versus DDR3 memories (e.g., 70% $V_{DDO}$ versus 50% $V_{DDO}$). Without level shifting, when communicating with a DDR4 memory, the receiver typically would generate bit errors.

In operation in one embodiment, the first amplifier 202 is configured to output the ground voltage 218 to the common output node 208 when the data signal 206 received at the first amplifier 202 (e.g., an unshifted data signal in the first mode of operation or a shifted data signal in the second mode of operation) fails to exceed the voltage reference signal received at the first amplifier 202 (e.g., an unshifted voltage reference signal in the first mode of operation or a shifted voltage reference signal in the second mode of operation). In that embodiment, the second amplifier 210 is configured to output a supply voltage 216 to the common output node 208 when the data signal received at the second amplifier 210 exceeds the voltage reference signal received at the second amplifier 210. Thus, the first amplifier 202 and the second amplifier 210 work in concert to generate the output signal to the common output node 208.

Figure 3:
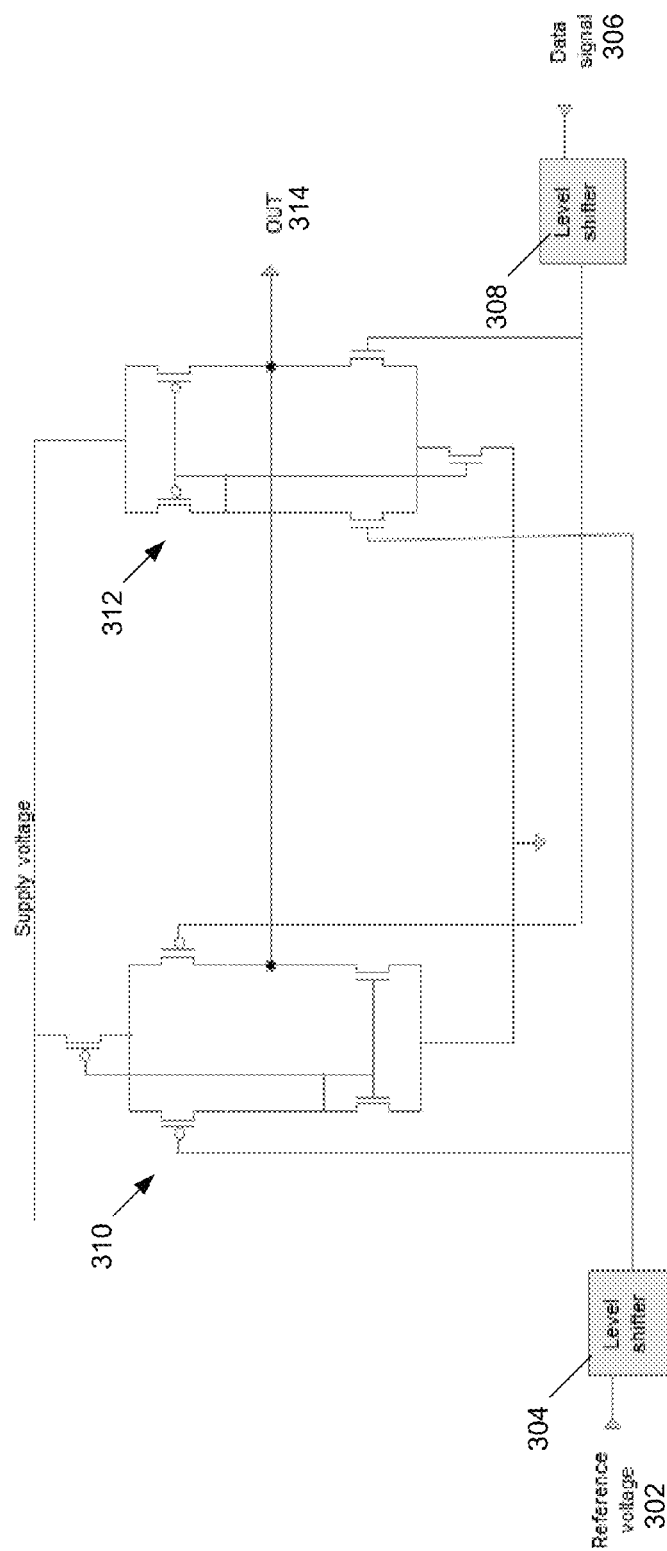
FIG. 3 is a diagram depicting an example implementation of a receiver device as depicted in FIG. 2.

FIG. 3 is a diagram depicting circuitry details of an example implementation of the receiver device depicted in FIG. 2. In the embodiment of FIG. 3, a voltage reference signal 302 is received and provided to a voltage reference level shifter 304, and a data signal 306 is received and provided to a data signal level shifter 308. The voltage reference level shifter 304 and the data signal level shifter 308 are configured to selectively level shift the voltage reference signal and the data signal, respectively, based on a current mode of operation (e.g., whether the receiver is currently communicating with a DDR3 memory or a DDR4 memory). The embodiment of FIG. 3 includes a first amplifier 310 and a second amplifier 312 that are both implemented in CMOS technology. The first amplifier 310 includes PMOS transistors at its input stage for receiving the voltage reference signal 302 and the data signal 306, where the second amplifier 312 includes NMOS transistors at its input stage for receiving the voltage reference signal 302 and the data signal 306. The two amplifiers 310, 312 work in concert to generate an output signal to a common output node 314. In one embodiment of the disclosure, the two amplifiers 310, 312 are implemented in concert because one of those amplifiers 310, 312 (e.g., the PMOS transistor input stage first amplifier 310) is configured to have an operating point that better supplies the supply voltage to the common output node 314, while the other of those amplifiers (e.g., the NMOS transistor input stage second amplifier 312) is configured to have an operating point that better supplies the ground voltage to the common output node 314.

Figure 4:
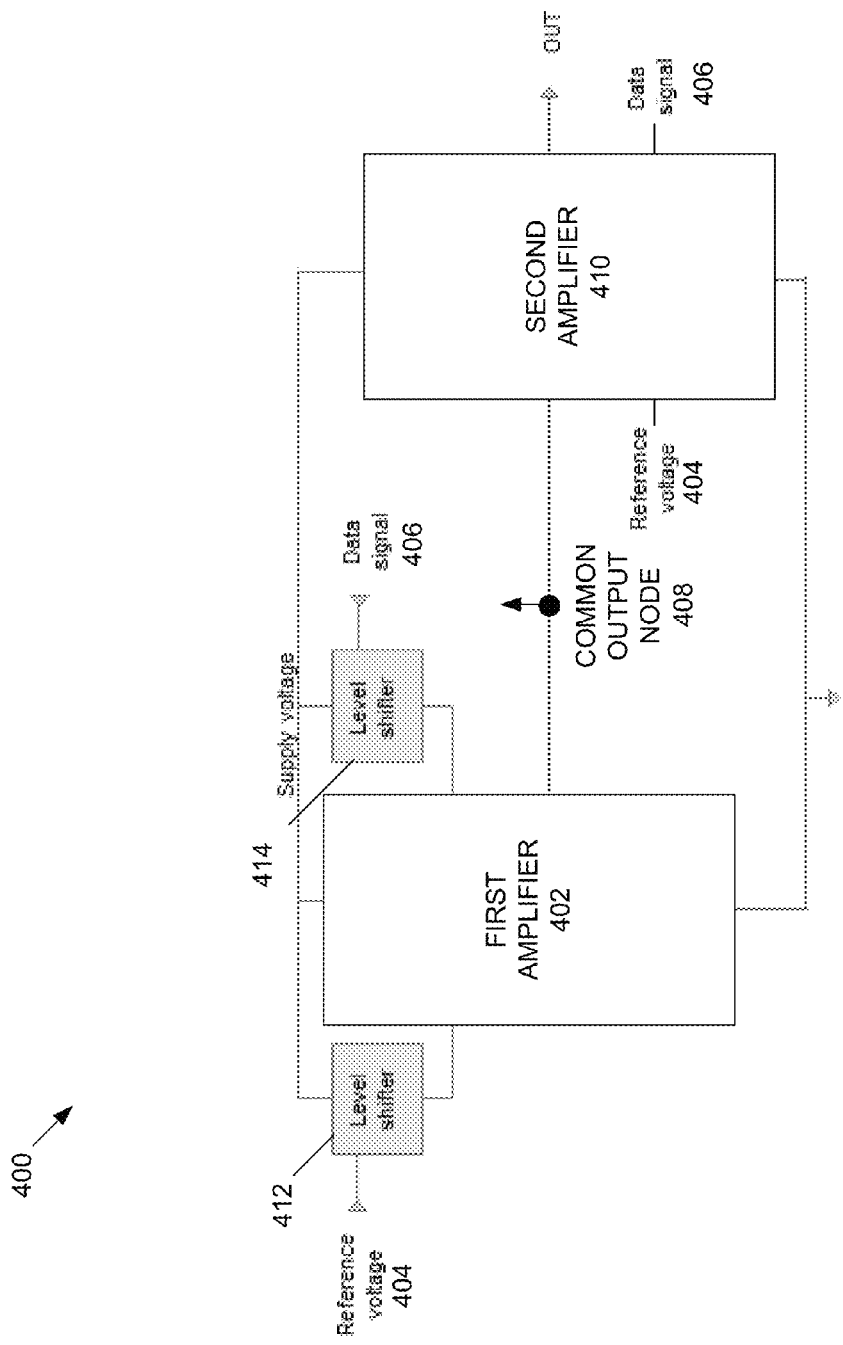
FIG. 4 is a block diagram depicting a receiver device that only performs selective level shifting of the voltage reference signal supplied to the first amplifier and the data signal supplied to the first amplifier, without level shifting signals provided to the second amplifier.

In an embodiment where a first amplifier is configured to output a ground voltage when a voltage of a received data signal fails to exceed a voltage of a received voltage reference signal and where the received voltage reference signal is at a higher voltage in one mode of operation, the first amplifier is more prone to bit errors (e.g., outputting the supply voltage representing a 1-value bit rather than a correct ground voltage representing a 0-bit or vice versa) than a second amplifier that is configured to output a supply voltage when the received data signal exceeds the voltage reference signal. FIG. 4 is a block diagram depicting a receiver device that only performs selective level shifting of the voltage reference signal and the data signal that are supplied to the first amplifier, without level shifting signals supplied to the second amplifier. By not level shifting signals provided to the second amplifier, a component and space cost savings can be achieved while still facilitating operation of the receiver device for use with multiple memory types. The receiver 400 includes a first amplifier 402 configured to receive a voltage reference signal 404 and a data signal 406, the data signal being received from a memory device. The first amplifier 402 is configured to output a first output signal to a common output node 408 based on a first voltage level comparison of the data signal 406 to the voltage reference signal 404.

A second amplifier 410 is configured to receive the voltage reference signal 404 and the data signal 406, the data signal being received from the memory device. The second amplifier 410 is configured to output a second output signal to the common output node 408 based on a second comparison of the data signal 406 to the voltage reference signal 404. The receiver includes a voltage reference level shifter 412. The voltage reference level shifter 412 is configured to selectively level shift the voltage reference signal 404 supplied to the first amplifier 402. A data signal level shifter 414 is disposed between the memory device and the first amplifier 402. The data signal level shifter 414 is configured to selectively level shift the data signal 406 supplied to the first amplifier 402.

Figure 5:
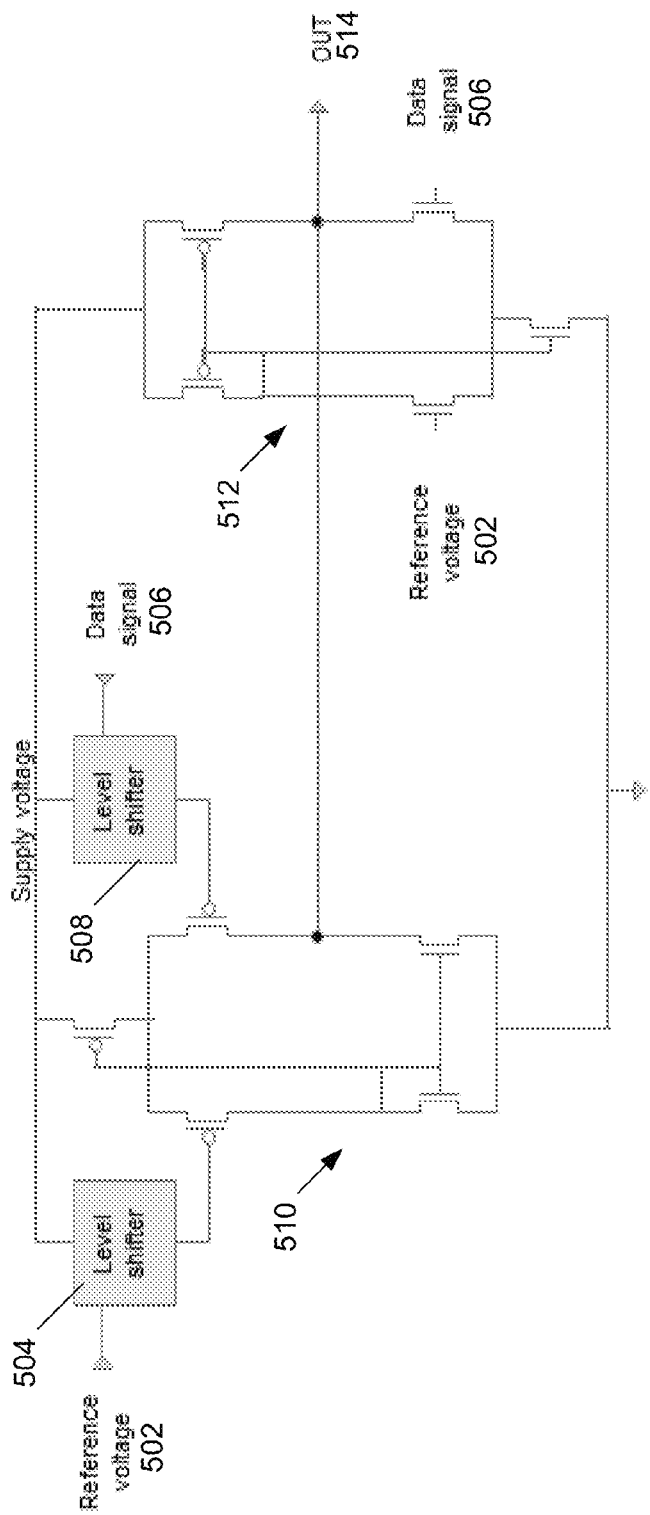
FIG. 5 is a diagram depicting an example implementation of a receiver device as depicted in FIG. 4.

FIG. 5 is a diagram depicting an example implementation of a receiver device as depicted in FIG. 4. In the embodiment of FIG. 5, a voltage reference signal 502 is received and provided to a voltage reference level shifter 504, and a data signal 506 is received and provided to a data signal level shifter 508. The voltage reference level shifter 504 and the data signal level shifter 508 are configured to selectively level shift the voltage reference signal 502 and the data signal 506, respectively, based on a current mode of operation (e.g., whether the receiver device is communicating with a memory of a first type or a memory of a second type). The embodiment of FIG. 5 includes a first amplifier 510 and a second amplifier 512 that are both implemented in CMOS technology. However, other implementation technologies are also suitable. The first amplifier 510 includes PMOS transistors at its input stage for receiving the voltage reference signal 502 and the data signal 506, where each of those signals 502, 506 may be level shifted at 504, 508, respectively, based on a current mode of operation. The second amplifier 512 includes NMOS transistors at its input stage for receiving the voltage reference signal 502 and the data signal 506, where the second amplifier 512 receives the voltage reference signal 502 and the data signal 506 without prior processing by level shifters 504, 508. The two amplifiers 510, 512 work in concert to generate an output signal to a common output node 514 (e.g., an output node to which both the first receiver 510 and the second receiver 512 are connected).

Figure 6:
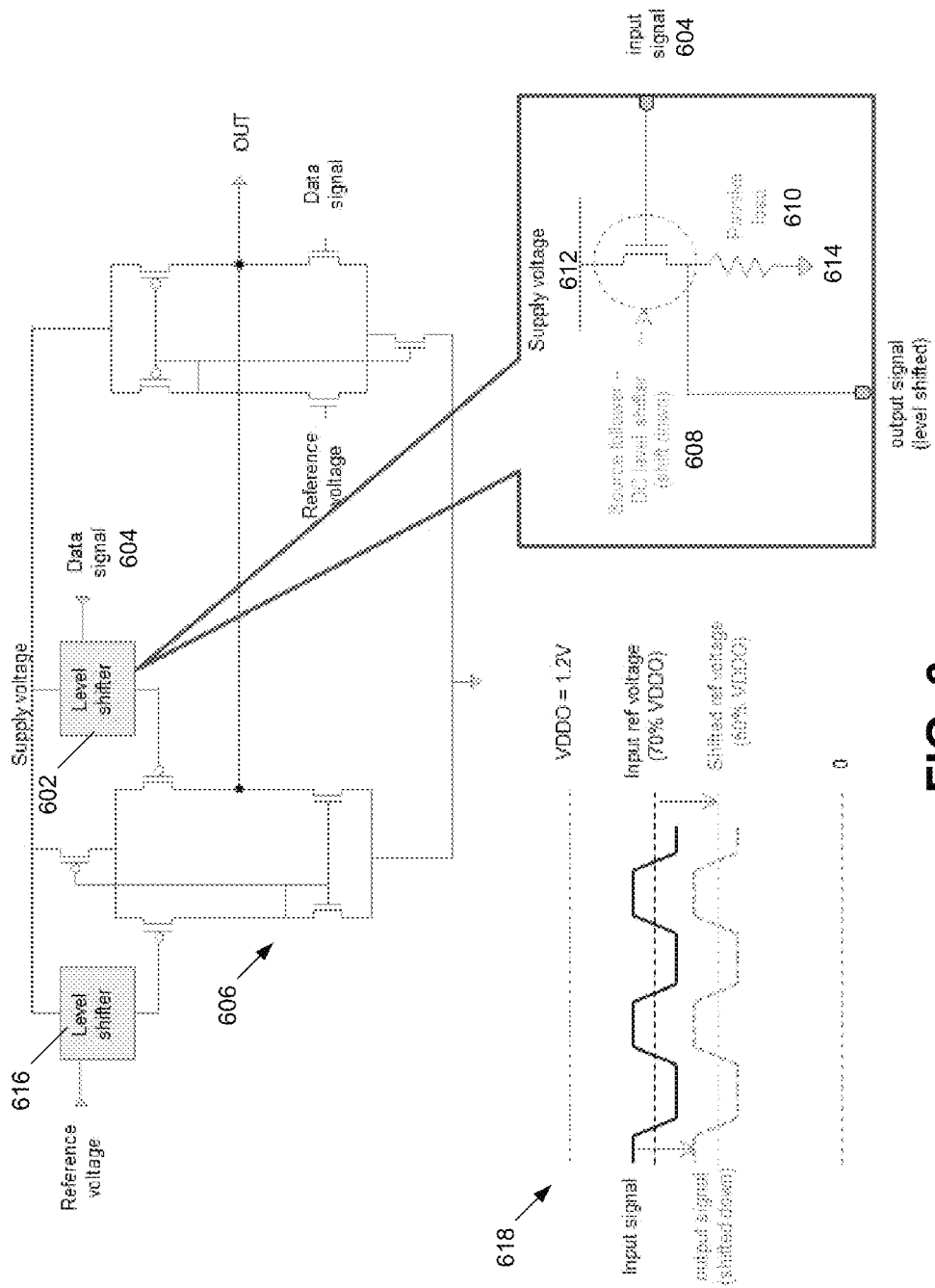
FIG. 6 is a diagram depicting an implementation of a data signal level shifter in accordance with one embodiment of the disclosure.

FIG. 6 is a diagram depicting in greater detail an implementation of a data signal level shifter in accordance with one embodiment of the disclosure. In the example of FIG. 6, the data signal level shifter 602 is disposed along data signal line 604, between the memory device and the first amplifier 606, and is implemented in an embodiment using a source follower transistor 608 and a passive load 610 connected in series between a supply voltage node 612 and a ground node 614. In one embodiment of the disclosure, a voltage reference level shifter 616 is implemented using similar or identical components. As illustrated in the graph 618 of FIG. 6, when operating in a second mode of operation (e.g., when communicating with a DDR4 memory) where the voltage reference signal and the data signal are selectively shifted down, the voltage reference signal is level shifted from 70% of $V_{DDO}$ to 50% of $V_{DDO}$, and the average voltage of the data signal is shifted down from 70% of $V_{DDO}$ to 50% of $V_{DDO}$, in an embodiment.

In one embodiment of the disclosure, data signals received by a receiver are single ended signals that are sensitive to their reference comparison voltage level, such that a small variance (e.g., 0.05 volts) in a reference voltage from a voltage level that is expected results in bit errors. For example, a reference voltage at an incorrect voltage level can result in an incorrect timing of detections of transitions of a clock signal from a low voltage level to a high voltage level and vice versa, such that timing windows are incorrectly extended or contracted. To compensate in one embodiment of the disclosure, a receiver for communicating with memories or other types of devices comprises level shifters that include calibration inputs, where amounts of selective voltage level shifting applied in certain modes of operation are adjusted based on magnitudes of the calibration inputs. Such adjustments, in one embodiment, restore the reference voltage to its expected level. That adjustment enables the receiver to properly detect signal transitions and enables the proper downstream sampling of the signal.

Figure 7:
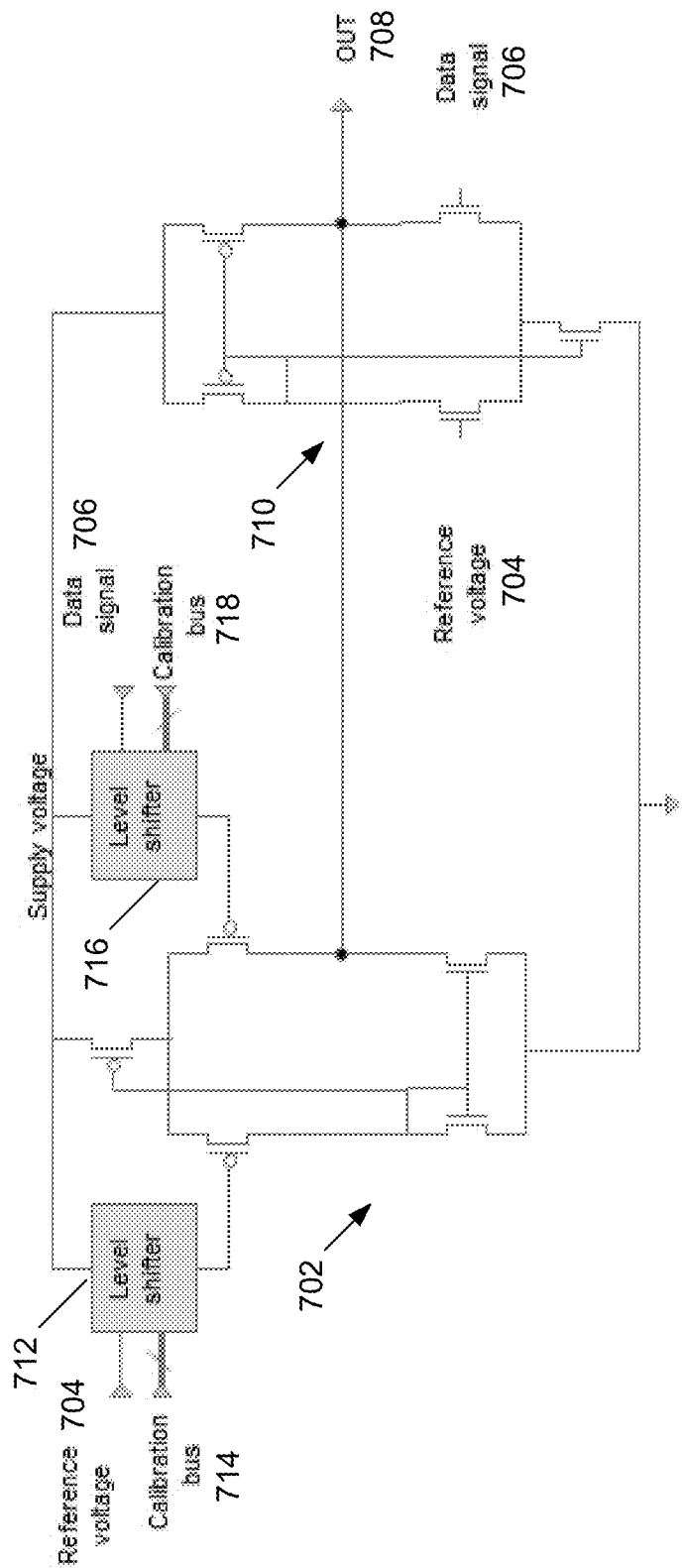
FIG. 7 is a block diagram depicting a receiver having a voltage reference level shifter and a data signal level shifter having calibration inputs in accordance with one embodiment of the disclosure.

FIG. 7 is a block diagram depicting a receiver having a voltage reference level shifter and a data signal level shifter having calibration inputs in accordance with one embodiment of the disclosure. The receiver includes a first amplifier 702 that is configured to receive a voltage reference signal 704 and a data signal 706. The first amplifier 702 is configured to output a first output signal to a common output node 708 based on a first comparison of a voltage level the data signal 706 to a voltage level of the voltage reference signal 704. A second amplifier 710 is configured to receive the voltage reference signal 704 and the data signal 706 and to output a second output signal to the common output node 708 based on a second voltage level comparison of the data signal 706 and the voltage reference signal 704. The receiver further includes a voltage reference level shifter 712. The voltage reference level shifter 712 is configured to selectively (i.e., based on a type of device with which the receiver is communicating) level shift the voltage reference signal 704 supplied to the first amplifier 702. The voltage reference level shifter 712 includes a calibration input 714. The voltage reference level shifter 712 is configured to adjust (for instance by way of a manual or automated adjustment to match an expected reference voltage level) an amount of selective level shifting to apply to the voltage reference signal 704 based on a magnitude of the calibration input 714. The receiver further includes a data signal level shifter 716. The data signal level shifter 716 is configured to selectively level shift the data signal 706 supplied to the first amplifier 702. The data signal level shifter 716 includes a calibration input 718, where the data signal level shifter 716 is configured to adjust an amount of selective level shifting to apply to the data signal 706 based on the received calibration input 718.

Figure 8:
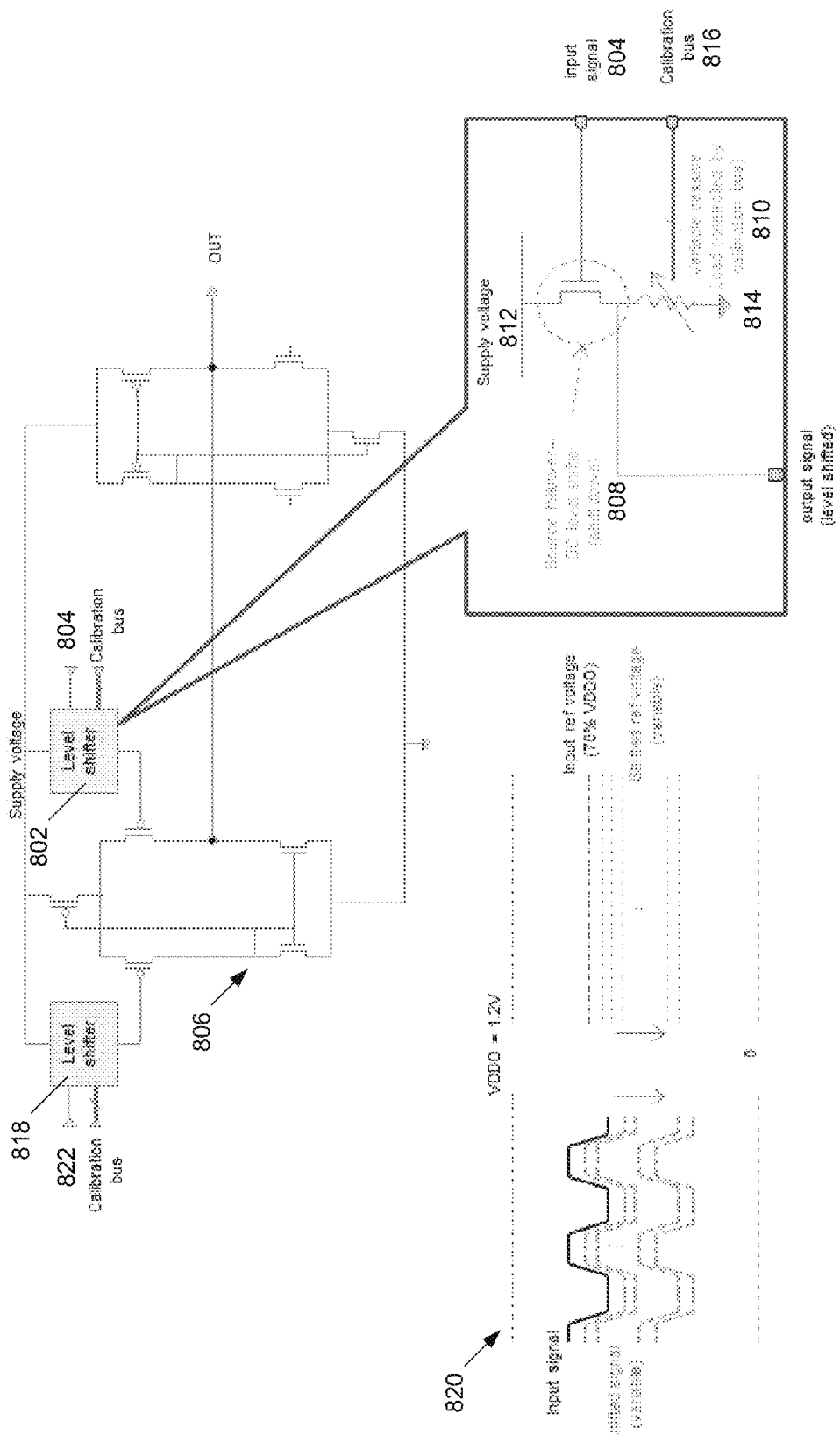
FIG. 8 is a diagram depicting an implementation of a data signal level shifter in accordance with one embodiment of the disclosure.

FIG. 8 is a diagram depicting an implementation of a data signal level shifter in accordance with one embodiment of the disclosure. In the example of FIG. 8, the data signal level shifter 802 is disposed between the memory device, via data signal line 804, and the first amplifier 806, and is implemented using a source follower transistor 808 and a passive load 810 connected in series between a supply voltage node 812 and a ground node 814, in an embodiment. In the example of FIG. 8, the passive load 810 is adjustable based on the calibration signal 816. In one embodiment of the disclosure, a voltage reference level shifter 818 is implemented using similar or identical components as depicted in the detailed view of the data signal level shifter 802. As illustrated in the graph 820 of FIG. 8, when operating in a second mode of operation where the voltage reference signal and the data signal are selectively shifted down, the voltage reference signal is level shifted from 70% of $V_{DDQ}$ to 50% of $V_{DDQ}$, and the average voltage of the data signal is shifted down from 70% of $V_{DDQ}$, to 50% of $V_{DDQ}$. In all modes of operation, smaller variations of levels of the voltage reference signal and the data signal are accomplished via variation (for instance by way of a manual or automated adjustment to match an expected reference voltage level) of the passive loads 810 in the respective level shifters 802, 818, as commanded by calibration inputs to the level shifters 802, 818. In one embodiment of the disclosure, the amount of variance in level shifting applied to the voltage reference signal 822 based on a calibration input is independent of the amount of variance in level shifting applied to the data signal 804. In another embodiment of the disclosure, the voltage reference level shifter 818 is configured to level shift the voltage reference signal 822 in an opposite direction than the data signal level shifter 802 is configured to level shift the data signal 804.

In one embodiment of the disclosure, calibration inputs to a voltage reference level shifter and a data signal level shifter are manually set via experimentation. In another embodiment of the disclosure, the respective calibration inputs are periodically adjusted based on calibration operations. In one example, a calibration operation includes inputting known data to a memory device. The known data is received from the memory device at the receiver, where the known data is expected to be received during a data window period. A calibration input of the voltage reverence level shifter of the receiver is adjusted in a first direction when the known data is detected by the receiver as being received for a lesser period of time than the data window period. The voltage reference level shifter calibration input of the receiver is adjusted in a second direction opposite to the first direction when the known data is detected as being received by the receiver for a greater period of time than the data window period. In one embodiment, such a calibration operation is performed periodically, such as once every data transmission cycle, or once every n data transmission cycles. In one embodiment of the disclosure, a calibration input is provided to the data signal level shifter, where the calibration input signal to the data signal level shifter commands a magnitude of level shifting applied to the data signal, where the data signal is shifted in an opposite direction from the voltage reference signal.

Figure 9:
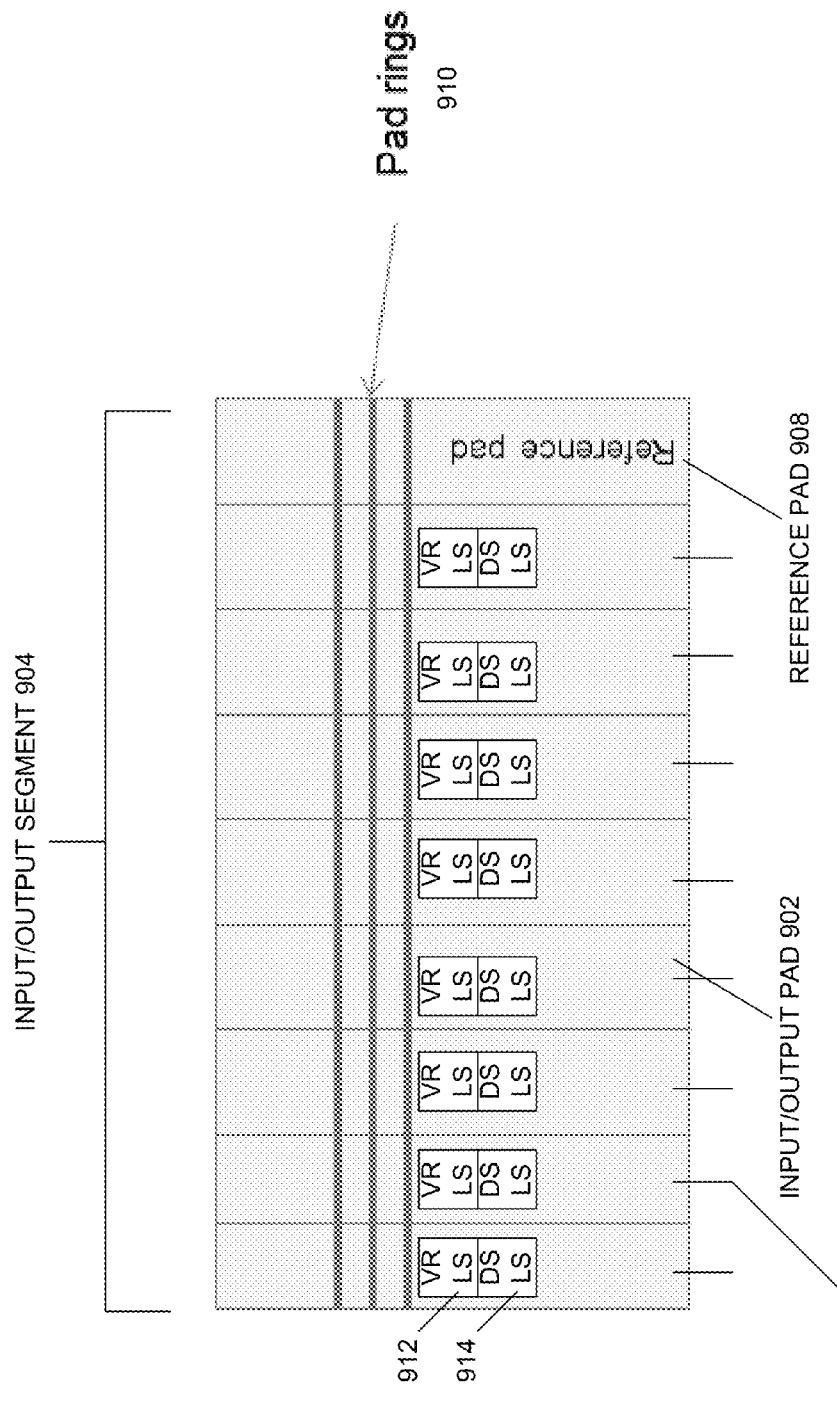
FIG. 9 is a block diagram depicting an input/output segment including a plurality of receivers that include voltage reference level shifters and data signal level shifters.

In one embodiment of the disclosure, a system includes a plurality of receivers, such as those described herein above. In that embodiment, each of the receivers is associated with an input/output pad of an input/output segment. FIG. 9 is a block diagram depicting an input/output segment including a plurality of receivers that include voltage reference (VR) level shifters and data signal (DS) level shifters. Each of a plurality of input/output pads 902 of the input/output segment 904 is configured to receive data from one data line 906 of a device with which the segment 904 is communicating. A reference pad 908 receives or generates a voltage reference signal and provides the voltage reference signal to the input/output pads 902 via a pad ring 910. Each of the input/output pads 902 includes a voltage reference level shifter 912 and/or a data signal level shifter 914 for providing local adjustment of voltage reference signals and data signals received at the individual input/output pads 902. In one embodiment of the disclosure, calibration inputs to the voltage reference level shifters 912 and the data signal level shifters 914 are provided individually and at independent levels to each of the input/output pads 902 based on determinations of calibration operations.

Figure 10:
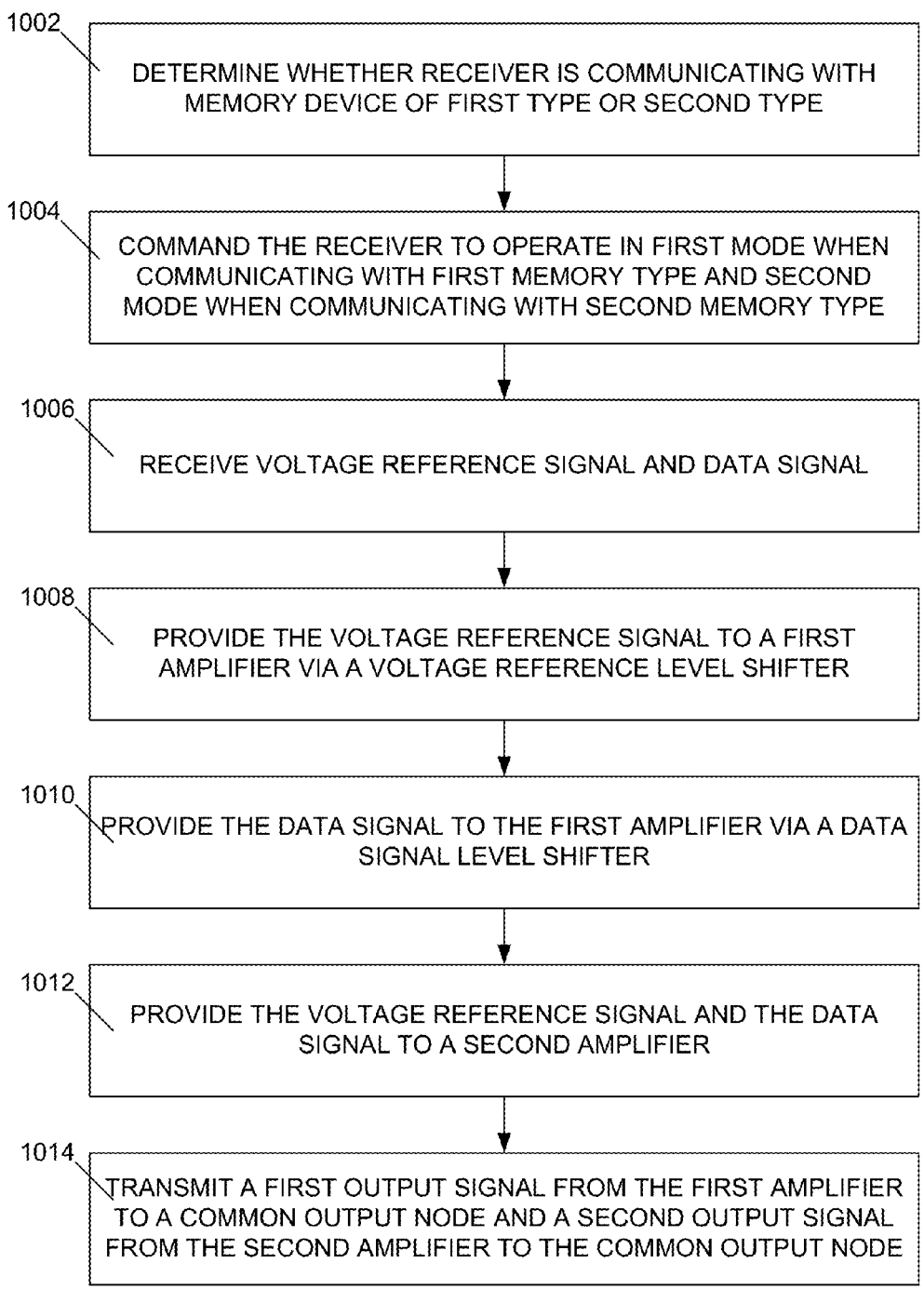
FIG. 10 is a flow diagram depicting a method of receiving data signals from memory devices of disparate types.

FIG. 10 is a flow diagram depicting a method of receiving data signals from memory devices of disparate types. At 1002, the method determines whether a receiver is communicating with a memory device of a first memory type or a second memory type (e.g., based on an external command). At 1004, the method commands receiver to operate in a first mode when the receiver is communicating with the first memory type and a second mode when the receiver is communicating with the second memory type. At 1006, the method receives a voltage reference signal and a data signal, wherein the data signal is received from the memory device. At 1008, the method provides the voltage reference signal to a first amplifier of the receiver via a voltage reference level shifter. The voltage reference level shifter is configured to selectively level shift the voltage reference signal based on whether the receiver is operating in the first mode or the second mode, in an embodiment. At 1010, the method provides the data signal to the first amplifier of the receiver via a data signal level shifter. The data signal level shifter is configured to selectively level shift the data signal based on whether the receiver is operating in the first mode or the second mode, in an embodiment. At 1012, the method provides the voltage reference signal and the data signal to a second amplifier of the receiver (e.g., level shifted versions of the voltage reference signal and the data signal or unshifted versions of the voltage reference signal and the data signal). At 1014, a first output signal is transmitted from the first amplifier to a common output node, and a second output signal is transmitted from the second amplifier to the common output node.

Figure 11:
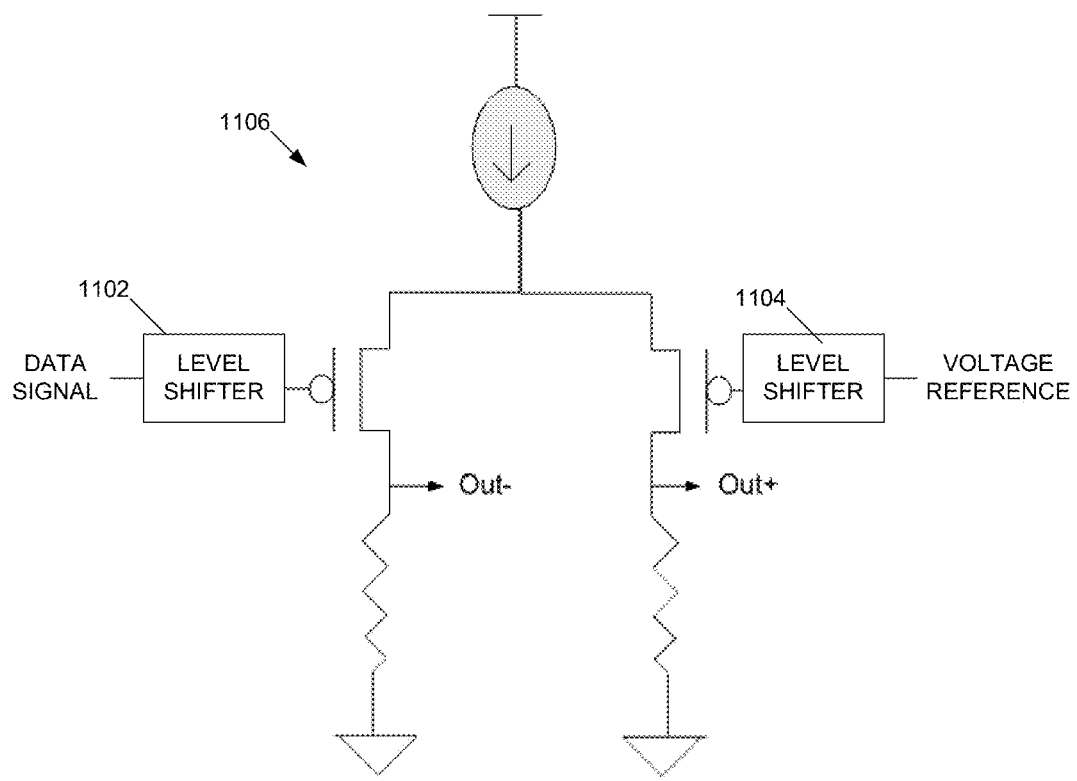
FIG. 11 is a diagram depicting a single amplifier configured to generate an output signal based on a selectively shifted data signal and a selectively shifted reference voltage signal.

In addition to the two amplifier implementations as described herein above, in embodiments of the disclosure, systems and methods as described herein can be implemented using a single amplifier implementation. FIG. 11 is a diagram depicting a single amplifier configured to generate an output signal based on a selectively shifted data signal and a selectively shifted reference voltage signal. A data signal is received and is provided to a data signal level shifter 1102. A voltage reference signal is received and is provided to a voltage reference level shifter 1104. Outputs of the data signal level shifter 1102 and the voltage reference level shifter 1104 are provided to respective inputs of an amplifier 1106. The input data signal and the voltage reference signal are selectively voltage level shifted, in one embodiment, such as based on a type of device with which the data signals are being received. For example, when the data signal and the voltage reference signal are received from a device of a first type, the data signal and the voltage reference signal are not level shifted because the operational point of the amplifier 1106 is set to process signals consistent with the output format of the device of the first type. When the data signal and the voltage reference signal are received from a device of a second type, the data signal and the voltage reference signal are voltage level shifted, such that they appear to the amplifier 1106, which is configured to operate on signals from devices of the first type, to be coming from a device of the first type. While the embodiment of FIG. 11 discloses a PMOS type amplifier, the amplifier 1106, in one embodiment, is implemented as an NMOS type amplifier, where selective amounts of voltage level adjustment by the level shifters 1102, 1104 are different for the NMOS type amplifier implementation.

This application uses examples to illustrate the invention. The patentable scope of the invention includes other examples.

It is claimed:

1. A receiver device for receiving data signals from devices of disparate types, comprising:
    an amplifier configured to receive a voltage reference signal and a data signal, the data signal being received from a device, the amplifier being configured to output an output signal based on a comparison of the data signal to the voltage reference signal;
    a voltage reference level shifter, the voltage reference level shifter configured to selectively level shift the voltage reference signal supplied to the amplifier based on a type of device with which the receiver is communicating; and
    a data signal level shifter, the data signal level shifter configured to selectively level shift the data signal supplied to the amplifier based on the type of device with which the receiver is communicating.

2. The receiver of claim 1, wherein the amplifier further comprises:
    a first amplifier configured to receive the voltage reference signal and the data signal, the first amplifier being configured to output a first output signal, the first output signal being based on a first comparison of the data signal to the voltage reference signal;
    a second amplifier configured to receive the voltage reference signal and the data signal, the second amplifier being configured to output a second output signal, the second output signal being based on a second comparison of the data signal to the voltage reference signal.

3. The receiver of claim 2, wherein the first amplifier comprises a PMOS amplifier implemented with a PMOS input stage, and wherein the second amplifier comprises an NMOS amplifier with an NMOS input stage.

4. The receiver of claim 3, wherein the first amplifier is configured to output the first output signal at a ground voltage level when the data signal received by the first amplifier is lower than the reference signal received by the first amplifier; and
    wherein the second amplifier is configured to output the second output signal at a supply voltage level when the data signal received by the second amplifier is higher than the reference signal received by the second amplifier.

5. The receiver of claim 2, wherein the second amplifier is configured to receive the voltage reference signal and the data signal without the voltage reference signal and the data signal traversing a level shifter between the device and the second amplifier.

6. The receiver of claim 1, wherein the receiver device is configured to operate in a first mode and in a second mode;
    wherein the first mode of operation is associated with devices of a first type, wherein the voltage reference level shifter and the data signal level shifter are configured to not level shift the voltage reference signal and the data signal, respectively, when the receiver is operating in the first mode of operation;
    wherein the second mode of operation is associated with devices of a second type, wherein the voltage reference level shifter and the data signal level shifter are configured to level shift the voltage reference and the data signal, respectively, to levels consistent with devices of the first type, when the receiver is operating in the second mode of operation.

7. The receiver of claim 6, wherein the first mode of operation is associated with DDR3 memories, and wherein the second mode of operation is associated with DDR4 memories.

8. The receiver of claim 1, wherein the receiver further includes a supply voltage input having a supply voltage level, wherein the voltage reference level shifter is configured to level shift the voltage reference signal from about 70% of the supply voltage level to about 50% of the supply voltage level.

9. The receiver of claim 1, wherein the data signal level shifter is also interposed between the device and the second amplifier.

10. The receiver of claim 1, wherein the receiver is configured to receive a single ended data signal.

11. The receiver of claim 1, wherein the voltage reference level shifter and the data signal level shifter each comprise a source follower transistor and a passive load connected in series between a supply voltage node and a ground voltage node.

12. The receiver of claim 1, wherein the voltage reference level shifter includes a calibration input, wherein the voltage reference level shifter is configured to adjust an amount of selective level shifting to apply to the voltage reference signal based on the calibration input received at the voltage reference level shifter calibration input;

wherein the data signal level shifter includes a calibration input, wherein the data signal level shifter is configured to adjust an amount of selective level shifting to apply to the data signal based on the calibration input received at the data signal level shifter calibration input.

13. The receiver of claim 12, wherein the voltage reference level shifter is configured to level shift the voltage reference signal in an opposite direction than the data signal level shifter is configured to level shift the data signal.

14. A system, comprising:
a plurality of receivers according to claim 11, wherein each of the plurality of receivers is associated with an input/output pad of an input/output segment;
wherein the voltage reference signal is provided to each of the plurality of receivers via a pad ring.

15. The system of claim 14, wherein each of the receivers receives an individual voltage reference level shifter calibration input and an individual data signal level shifter calibration input.

16. The system of claim 14, further comprising:
a data processor, the data processor being configured to execute steps comprising:
inputting known data to the device;
receiving known data from the device at a particular one of the plurality of receivers, wherein the known data is expected to be received during a data window period;
adjusting the voltage reference level shifter calibration input of the particular receiver in a first direction when the known data is detected by the particular receiver as being received for a lesser period of time than the data window period; and
adjusting the voltage reference level shifter calibration input of the particular receiver in a second direction opposite to the first direction when the known data is detected as being received by the particular receiver for a greater period of time than the data window period.

17. The receiver device of claim 1, wherein the selective level shifting of the data signal is between voltage levels corresponding to different devices, each of the different devices having respective voltage levels that are different.

18. A receiver device for receiving data signals, co/uprising:
a first amplifier configured to receive a voltage reference signal and a data signal, the first amplifier being configured to output a first output signal, the first output signal being based on a first comparison of the data signal to the voltage reference signal;
a voltage reference level shifter, the voltage reference level shifter configured to selectively level shift the voltage reference signal supplied to the first amplifier, the voltage reference level shifter includes a calibration input, the voltage reference level shifter being configured to adjust an amount of selective level shifting to apply to the voltage reference signal based on the calibration input received at the voltage reference level shifter calibration input; and
a data signal level shifter, the data signal level shifter configured to selectively level shift the data signal supplied to the first amplifier, the data signal level shifter including a calibration input, the data signal level shifter being configured to adjust an amount of selective level shifting to apply to the data signal based on the calibration input received at the data signal level shifter calibration input.

19. The receiver device of claim 18, wherein the selective level shifting of the data signal is between voltage levels corresponding to different devices, each of the different devices having respective voltage levels that are different.

20. A method of receiving data signals from devices of disparate types, comprising:
determining whether a receiver is communicating with a device of a first type or a second type;
commanding the receiver to operate in a first mode when the receiver is communicating with the first type and a second mode when the receiver is communicating with the second type;
receiving a voltage reference signal and a data signal, the data signal being received from the device;
providing the voltage reference signal to an amplifier of the receiver via a voltage reference level shifter, the voltage reference level shifter being configured to selectively level shift the voltage reference signal based on whether the receiver is operating in the first mode or the second mode;
providing the data signal to the amplifier of the receiver via a data signal level shifter, the data signal level shifter being, configured to selectively level shift the data signal based on whether the receiver is operating in the first mode or the second mode; and
transmitting a first output signal from the amplifier.

21. The method of claim 20, wherein determining comprises:
determining that the receiver is communicating with a device of the first type when the receiver is communicating with a DDR3 memory device, and
determining that the receiver is communicating with a device of the second when the receiver is communicating with a DDR4 memory device.

22. The method of claim 20, further comprising:
providing a calibration input signal to the voltage reference level shifter, wherein the calibration input signal commands a magnitude of level shifting applied to the voltage reference signal.

23. The method of claim 22, wherein a magnitude of the calibration input signal is based on a calibration operation, wherein the calibration operation comprises:
inputting known data to the device;
receiving the known data from the device at the receiver, wherein the known data is expected to be received during a data window period;
adjusting the voltage reference level shifter calibration input of the receiver in a first direction when the known data is detected by the receiver as being received for a lesser period of time than the data window period; and
adjusting the voltage reference level shifter calibration input of the receiver in a second direction opposite to the first direction when the known data is detected as being received by the receiver for a greater period of time than the data window period.

24. The method of claim 23, further comprising providing a calibration input to the data signal level shifter, wherein the calibration input signal to the data signal level shifter commands a magnitude of level shifting applied to the data signal, wherein the data signal is shifted in an opposite direction from the voltage reference signal.

25. The method of claim 20, wherein the selective level shifting of the data signal is between voltage levels corresponding to different devices, each of the different devices having respective voltage levels that are different.

\* \* \* \* \*